(12) United States Patent
Pedersen et al.

(10) Patent No.: US 10,826,231 B2
(45) Date of Patent: Nov. 3, 2020

(54) FIRE DETECTOR MOUNTING ASSEMBLY AND METHOD

(71) Applicant: Autronica Fire & Security AS, Trondheim (NO)

(72) Inventors: Ole Martin Pedersen, Trondheim (NO); Fredleif Buaas-Hansen, Stjørdal (NO); Per Johan Vannebo, Trondheim (NO)

(73) Assignee: AUTRONICA FIRE & SECURITY AS, Trondheim (NO)

( * ) Notice: Subject to any disclaimer, the term of this patent is extended or adjusted under 35 U.S.C. 154(b) by 0 days.

(21) Appl. No.: 16/098,400

(22) PCT Filed: May 3, 2016

(86) PCT No.: PCT/EP2016/059931
§ 371 (c)(1),
(2) Date: Nov. 1, 2018

(87) PCT Pub. No.: WO2017/190774
PCT Pub. Date: Nov. 9, 2017

(65) Prior Publication Data
US 2019/0173227 A1 Jun. 6, 2019

(51) Int. Cl.
*H01R 13/625* (2006.01)
*G08B 17/113* (2006.01)
(Continued)

(52) U.S. Cl.
CPC ......... *H01R 13/625* (2013.01); *G08B 17/113* (2013.01); *H01R 43/26* (2013.01); *H05K 5/0217* (2013.01); *H05K 5/0247* (2013.01)

(58) Field of Classification Search
CPC .... H01R 13/625; H01R 43/26; G08B 17/113; H05K 5/0217; H05K 5/0247
See application file for complete search history.

(56) References Cited

U.S. PATENT DOCUMENTS 3,767,917 A * 10/1973 Lampart .............. G08B 17/113
250/384
4,229,064 A   10/1980 Vetter et al.
(Continued)

FOREIGN PATENT DOCUMENTS

CN      100478670 C    4/2009
CN      102903199 A    1/2013
(Continued)

OTHER PUBLICATIONS

International Search Report and Written Opinion regarding related PCT App. No. PCT/EP2016/059931; dated Jan. 25, 2017; 11 pgs.
(Continued)

*Primary Examiner* — Oscar C Jimenez
(74) *Attorney, Agent, or Firm* — Cantor & Colburn LLP

(57) ABSTRACT

A fire detector mounting assembly includes a housing having a first electrical connector device disposed on an engagement side of the housing. The assembly also includes a socket operatively coupleable to the housing, the socket having a second electrical connector device axially engageable with the first electrical connector device to electrically connect the housing and the socket. The assembly further includes a housing collar located at a radially outer location of the housing, the housing collar independently rotatable relative to the rest of the housing.

10 Claims, 3 Drawing Sheets

(51) Int. Cl.
*H01R 43/26* (2006.01)
*H05K 5/02* (2006.01)

(56) References Cited

U.S. PATENT DOCUMENTS

| | | | |
|---|---|---|---|
| 4,238,679 A * | 12/1980 | Macmillan | G08B 17/113 |
| | | | 250/385.1 |
| 4,672,217 A | 6/1987 | Dobrzanski | |
| 5,067,909 A * | 11/1991 | Behning | H01R 13/62 |
| | | | 439/312 |
| 5,568,133 A | 10/1996 | Durrer et al. | |
| 5,710,541 A * | 1/1998 | Stanley | G08B 17/113 |
| | | | 340/628 |
| 6,336,822 B1 | 1/2002 | Luzzoli | |
| 6,358,076 B1 * | 3/2002 | Haag | H01R 13/6395 |
| | | | 439/320 |
| 7,034,702 B2 | 4/2006 | Thomas et al. | |
| 7,109,874 B2 | 9/2006 | Pilkington | |
| 7,336,165 B2 * | 2/2008 | Fuchs | G08B 17/10 |
| | | | 340/506 |
| 7,740,499 B1 * | 6/2010 | Willey | H01R 13/625 |
| | | | 439/332 |
| 8,303,336 B2 | 11/2012 | Smith | |
| 8,376,777 B2 | 2/2013 | Smith | |
| 9,805,571 B2 | 10/2017 | Leatherby | |
| 9,825,404 B2 | 11/2017 | Yoshigi et al. | |
| 10,164,393 B2 | 12/2018 | Usuelli | |
| 2008/0246618 A1 | 10/2008 | Siber et al. | |
| 2011/0021057 A1 * | 1/2011 | Katagiyama | H01R 13/625 |
| | | | 439/345 |
| 2012/0285710 A1 * | 11/2012 | Umehara | A62C 3/16 |
| | | | 169/61 |
| 2015/0030375 A1 | 1/2015 | Kawaguchi et al. | |
| 2015/0180167 A1 * | 6/2015 | Haas | H01R 13/64 |
| | | | 439/311 |
| 2016/0049764 A1 * | 2/2016 | Usuelli | H01R 13/625 |
| | | | 29/747 |
| 2017/0117664 A1 * | 4/2017 | Yoshigi | H01R 12/58 |
| 2017/0279230 A1 * | 9/2017 | Komoto | H01R 13/73 |
| 2018/0328368 A1 | 11/2018 | Heiniger et al. | |

FOREIGN PATENT DOCUMENTS

| | | |
|---|---|---|
| CN | 202771575 U | 3/2013 |
| CN | 207397453 U | 5/2018 |
| DE | 19733375 A1 | 2/1999 |
| EP | 0567820 B1 | 6/1997 |
| EP | 2500639 A2 | 9/2012 |
| EP | 3321903 A1 | 5/2018 |
| GB | 2382204 A | 5/2003 |
| WO | 2008096014 A1 | 8/2008 |
| WO | 2017190774 A1 | 11/2017 |

OTHER PUBLICATIONS

BRK Electronics, "BRK User's Manual Smoke and Carbon Monoxide Alarm", 2002, 2 pages.
GM Techtronics, "GSM Switches and Diallers", available at: https://www.gmtechtronics.co.uk/index.php, accessed Oct. 9, 2019, 5 pages.
Kidde, "For model: i12060A Smoke Alarm User's Guide", Signaling Listed, available at: https://images.homedepot-static.com/catalog/pdfImages/62/629b4821-622a-4578-b865-be30f9802d74.pdf, accessed Oct. 9, 2019, 18 pages.

* cited by examiner

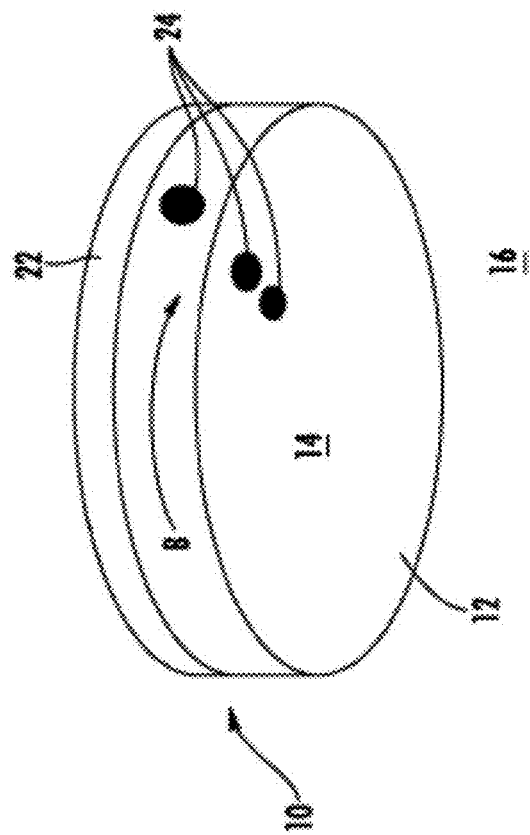
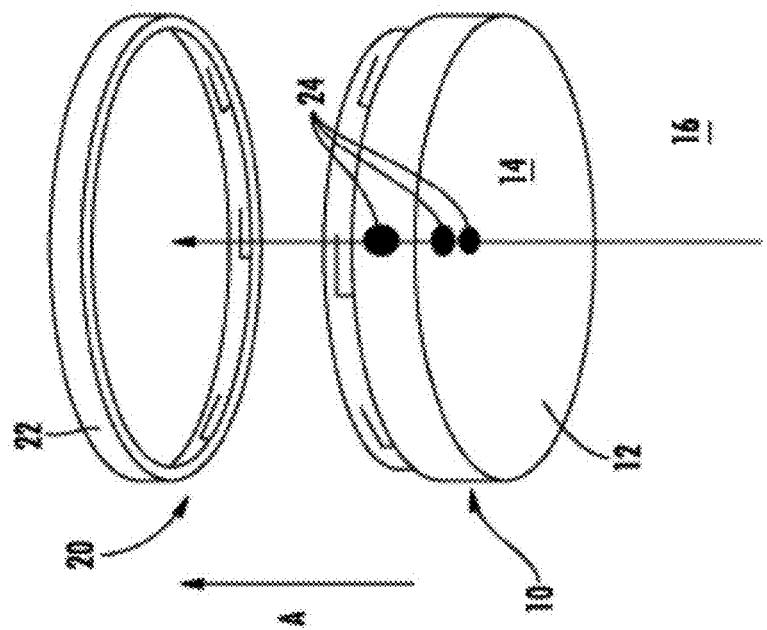

FIRE DETECTOR MOUNTING ASSEMBLY AND METHOD

CROSS-REFERENCE TO RELATED APPLICATIONS

This preliminary amendment is submitted with the application for entry into the U.S. National Phase under Chapter I. This application is based on PCT/EP2016/059931 filed on May 3, 2016, which is incorporated herein by reference in its entirety.

BACKGROUND OF THE DISCLOSURE

The embodiments described herein generally relate to fire detectors and, more particularly, to a mounting assembly for a fire detector, as well as a method of mounting the fire detector.

The ability to detect the presence of fire provides for the safety of occupants and property. Fire detectors are commonly employed to monitor environments for safety and/or damage concerns. If detection of a safety and/or damage concern arises, the fire detector generates an alert, typically audibly, to warn individuals in or near the environment and to alert emergency response personnel of the issue.

Fire detectors are typically connected to a wall or ceiling mounted detector socket by angular rotation. Such a mounting assembly typically requires rotation of the entire detector housing when mating with the socket. This radial mating principle limits the connecting strategies available for electrically connecting the socket and detector. An inexpensive assembly and method for connecting the detector and socket, as well as an option for easily adding more electrical connections, when needed, would be well received in the art.

BRIEF DESCRIPTION OF THE DISCLOSURE

According to one embodiment, a fire detector mounting assembly includes a housing having a first electrical connector device disposed on an engagement side of the housing. The assembly also includes a socket operatively coupleable to the housing, the socket having a second electrical connector device axially engageable with the first electrical connector device to electrically connect the housing and the socket. The assembly further includes a housing collar located at a radially outer location of the housing, the housing collar independently rotatable relative to the rest of the housing.

In addition to one or more of the features described above, or as an alternative, further embodiments may include that rotation of the housing collar interacts with the socket to axially displace the housing to a final assembled condition.

In addition to one or more of the features described above, or as an alternative, further embodiments may include that the housing collar comprises a bayonet ring engageable with the socket.

In addition to one or more of the features described above, or as an alternative, further embodiments may include that the socket comprises a bayonet ring engageable with the housing collar.

In addition to one or more of the features described above, or as an alternative, further embodiments may include that the housing collar and the socket each include corresponding threads engageable with each other to couple the housing to the socket.

In addition to one or more of the features described above, or as an alternative, further embodiments may include that the first electrical connector device comprises a plurality of pin headers and the second electrical connector device comprises a plurality of electrical board receptacles, each of the electrical board receptacles configured to axially receive one of the plurality of pin headers.

In addition to one or more of the features described above, or as an alternative, further embodiments may include that the first electrical connector device comprises a plurality of electrical board receptacles and the second electrical connector device comprises a plurality of pin headers, each of the electrical board receptacles configured to axially receive one of the plurality of pin headers.

According to another embodiment, a method of mounting a fire detector includes rotating a housing to an alignment position relative to a socket configured to couple to the housing. The method also includes axially displacing the housing into the socket to an initial engagement position when the housing is in the alignment position. The method further includes rotating a housing collar of the housing independently of the rest of the housing to couple the housing to the socket and to the final engagement position of the housing and the socket.

In addition to one or more of the features described above, or as an alternative, further embodiments may include that the first electrical connector device is axially displaced into engagement with the second electrical connector device during rotation of the housing collar.

In addition to one or more of the features described above, or as an alternative, further embodiments may include that the first electrical connector device and the second electrical connector device are not rotated during independent rotation of the housing collar.

In addition to one or more of the features described above, or as an alternative, further embodiments may include that the housing collar comprises a bayonet ring engageable with the socket.

In addition to one or more of the features described above, or as an alternative, further embodiments may include that the housing collar comprises threads engageable with corresponding threads disposed on the socket.

In addition to one or more of the features described above, or as an alternative, further embodiments may include that rotation of the housing collar axially displaces the housing to a final assembled condition comprising electrical connection between the first electrical connector device and the second electrical connector device, the final assembled condition further comprising coupling of the housing to the socket.

BRIEF DESCRIPTION OF THE DRAWINGS

The subject matter which is regarded as the disclosure is particularly pointed out and distinctly claimed in the claims at the conclusion of the specification. The foregoing and other features and advantages of the disclosure are apparent from the following detailed description taken in conjunction with the accompanying drawings in which:

FIG. 1 is a perspective view of a fire detector mounting assembly in a first assembly condition according to the prior art;

FIG. 2 is a perspective view of the fire detector mounting assembly of FIG. 1 in a second assembly condition;

DETAILED DESCRIPTION OF THE DISCLOSURE

Figure 4:
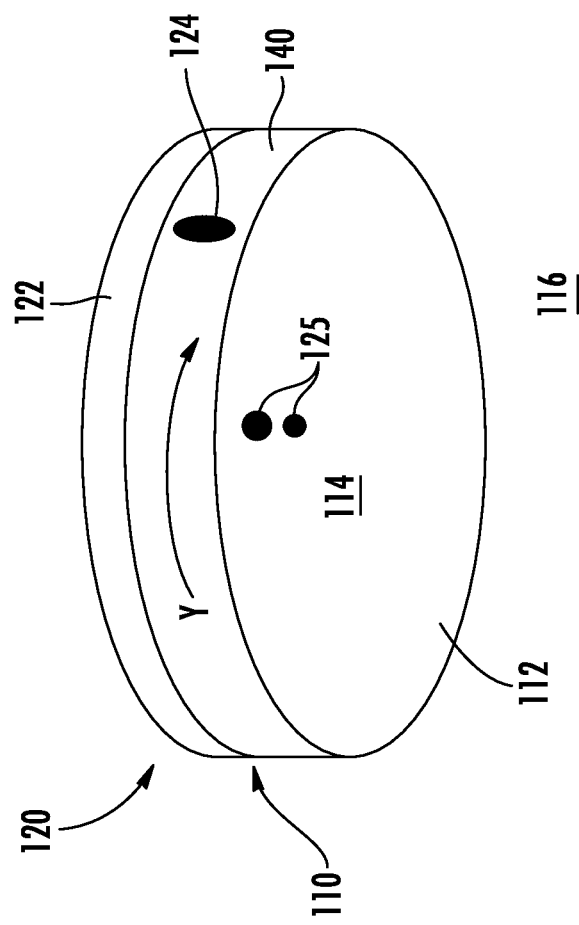
FIG. 4 is a perspective view of the fire detector mounting assembly of FIG. 3 in a second assembly condition.

Referring to FIGS. 1 and 2, a prior art fire detector is illustrated and generally referenced with numeral 10. The fire detector 10 includes a housing 12 that at least partially encloses internal components of the fire detector 10. The housing 12 includes an exposed surface 14 that is an exterior surface of the housing 12 exposed to an environment 16 that the fire detector 10 is configured to monitor. In particular, the fire detector 10 is configured to detect heat, smoke, and/or other conditions that are indicative of a safety and/or damage concern to the environment 16.

A mounting assembly 20 for the fire detector 10 is provided and includes a socket 22 to be mated to the housing 12. As shown, the housing 12 is axially displaced in direction A toward the socket 22 (FIG. 1). Once in a desired position, the entire housing 12 is rotated in direction B to couple the housing 12 to the socket 22 (FIG. 2). Visual indicators 24 that are merely provided for illustrative purposes evidence rotation of many parts or the entirety of the housing 12 during coupling of the housing 12 to the socket 22.

Figure 3:
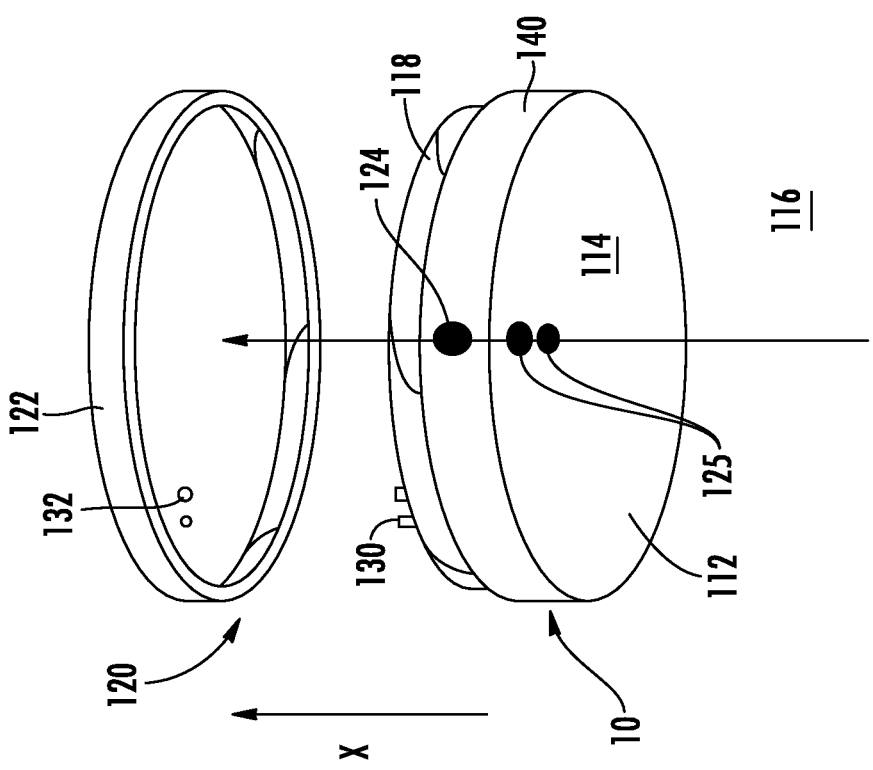
FIG. 3 is a perspective view of a fire detector mounting assembly in a first assembly condition according to an aspect of the disclosure.

Referring now to FIGS. 3 and 4, a mounting assembly 120 for a fire detector 110 according to the embodiments of the present disclosure is illustrated. A detector housing 112 at least partially encloses internal components, including a detector head 118, of the fire detector 110. The housing 112 includes an exposed surface 114 that is an exterior surface of the housing 112 exposed to an environment 116 that the fire detector 110 is configured to monitor. In particular, the fire detector 110 is configured to detect heat, smoke, and/or other conditions that are indicative of a safety and/or damage concern to the environment 116. The fire detector 110 may be a single detector used in a residential or commercial setting, or may be part of a safety system that includes a plurality of fire detectors. In some embodiments, such a system may include more than 10,000 fire detectors.

Figure 5:
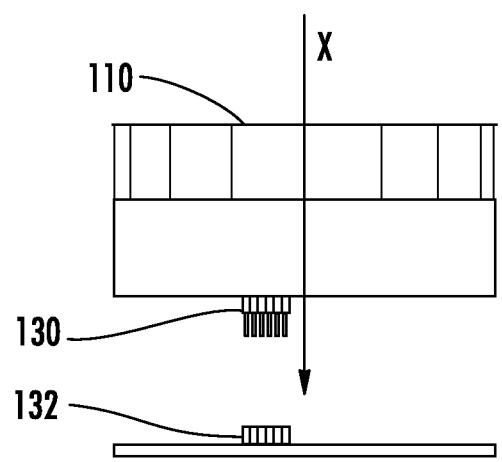
FIG. 5 is a perspective view of electrical connecting devices of the fire detector mounting assembly of FIGS. 3 and 4.

A socket 122 is provided to be mated to the housing 112. The fire detector head 118 includes at least one, but typically a plurality of first electrical connecting devices 130 to be electrically connected to at least one, but typically a plurality of second electrical connecting devices 132 disposed on an engagement side 134 of the socket 122, as shown in FIG. 5.

The housing 112 is placed into close proximity with the socket 122 and rotated until a desired alignment position is attained. In the alignment position, the housing 112 is axially displaced in direction X (FIG. 3) slightly to provide an initial engagement of the housing 112 and socket 122. For example, the slight axial displacement of the housing 112 may be 1-5 millimeters. Once the initial engagement position of the housing 112 and socket 122 is reached, a housing collar 140 is operated to electrically connect the first and second electrical connecting devices 130, 132 in an axial manner, as will be described in detail herein. By electrically connecting the first and second electrical connecting devices 130, 132 axially, less expensive and less complex electrical devices may be employed. For example, pin headers and board-to-board connectors may be employed to electrically connect the fire detector 110 with the socket 122. In some embodiments, the first electrical connecting device(s) 130 are pin headers and the second electrical connecting device (s) 132 are electrical board receptacles. In alternative embodiments, the reverse is the case, where the first electrical connecting device(s) 130 are electrical board receptacles and the second electrical connecting device(s) 132 are pin headers. The preceding example of electrical connecting devices is merely illustrative and not limiting of other contemplated devices.

Elimination of rotation of the overall housing 112, and therefore the electrical connecting devices 130, 132, is facilitated by the inclusion of a housing collar 140 that is independently rotatable in direction Y relative to the remainder of the housing 112 (FIG. 4). The housing collar 140 is located at a radially outer location of the housing 112 and is configured to engage the socket 122 in a manner that allows for coupling of the housing 112 to the socket 122 without rotating the housing 112 as a whole. Visual indicators 124, 125 that are merely provided for illustrative purposes evidence independent rotation of the housing collar 140 relative to the rest of the housing 112 during coupling of the housing 112 to the socket 122. In particular, indicator 124 is shown on the housing collar 140 and rotation of the housing collar 140 between the positions shown in FIGS. 1 and 2 does not result in rotation of the housing 112, as evidenced by indicators 125. Therefore, the housing 112 and electrical connecting devices 130, 132 do not rotate during axial coupling.

The housing collar 140 is only independently rotatable when in an unlocked position that occurs once the housing 112 is disposed in the above-described initial axial engagement position with the socket 122 (i.e., subsequent to attaining the alignment position). Independent rotation of the housing collar 140 axially displaces the housing 112 to cause the first and second electrical connecting devices 130, 132 to axially engage each other in a mating manner, while not requiring rotation of the electrical connecting devices 130, 132 or the housing 112. In some embodiments, the housing collar 140 is rotated to a stop position that includes an indicator to an operator. For example, an audible click may be provided to confirm to the operator that the housing 112 and socket 122 are in a final axial engagement position. In some embodiments, the housing collar 140 is independently rotatable over a range of about 40 degrees to about 50 degrees, and in some embodiments the housing collar 140 is rotated about 44 degrees to the final stop position.

In some embodiments, the housing collar 140 is a bayonet ring engageable with one or more features on the socket 122 to couple the housing 112 to the socket 122. In particular, a substantially L-shaped slot is provided on either the housing collar 140 or the socket 122 and is configured to receive one or more protrusions therein to axially retain the housing 112 and socket 122 upon rotation of the housing collar 140 to a desired location. Alternatively, a conventional threaded arrangement is contemplated. In such an arrangement, the socket 122 and housing collar 140 include corresponding respective threads engageable with each other.

Regardless of the precise structural feature that facilitates independent rotation of the housing collar 140 relative to the rest of the housing 112, rotation of the housing collar 140 interacts with the socket to axially displace the housing 112 to a final assembled condition with the socket 122. In operation, the housing 112 is axially displaced to engage the first and second electrical connecting devices 130, 132 to a first axial engagement location prior to rotating the housing collar 140. Subsequently, the housing collar 140 is independently rotated to ensure coupling of the housing 112 and socket 122, and to ensure electrical connection between the electrical connecting devices 130, 132.

Advantageously, the electrical connecting devices 130, 132 are mated solely in an axial direction due to ability of the devices to avoid rotation during rotation of the housing collar 140. Such a mounting assembly provides inexpensive options for establishing the electrical connection between the fire detector 110 and the socket 122. Additionally, configuration flexibility is provided by easily allowing additional connections, as needed.

The use of the terms "a" and "an" and "the" and similar referents in the context of the present disclosure (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

While the disclosure has been described in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that aspects of the disclosure may include only some of the described embodiments. Accordingly, the disclosure is not to be seen as limited by the foregoing description, but is only limited by the scope of the appended claims.

What is claimed is:

1. A fire detector mounting assembly comprising:
   a housing having a first electrical connector device disposed on an engagement side of the housing, the housing at least partially enclosing internal components configured to detect heat or smoke or fire;
   a socket operatively coupleable to the housing, the socket having a second electrical connector device axially engageable with the first electrical connector device to electrically connect the housing and the socket; and
   a housing collar located at a radially outer location of the housing, the housing collar independently rotatable relative to the rest of the housing;
   wherein rotation of the housing collar interacts with the socket to axially displace the housing to a final assembled condition.

2. The fire detector mounting assembly of claim 1, wherein the housing collar comprises a bayonet ring engageable with the socket.

3. The fire detector mounting assembly of claim 1, wherein the socket comprises a bayonet ring engageable with the housing collar.

4. The fire detector mounting assembly of claim 1, wherein the housing collar and the socket each include corresponding threads engageable with each other to couple the housing to the socket.

5. The fire detector mounting claim 1, wherein the first electrical connector device comprises a plurality of pin headers and the second electrical connector device comprises a plurality of electrical board receptacles, each of the electrical board receptacles configured to axially receive one of the plurality of pin headers.

6. The fire detector mounting assembly of claim 1, wherein the first electrical connector device comprises a plurality of electrical board receptacles and the second electrical connector device comprises a plurality of pin headers, each of the electrical board receptacles configured to axially receive one of the plurality of pin headers.

7. A method of mounting a fire detector comprising:
   rotating a housing to an alignment position relative to a socket configured to couple to the housing, the housing at least partially enclosing internal components configured to detect heat or smoke or fire;
   axially displacing the housing into the socket to an initial engagement position when the housing is in the alignment position; and
   rotating a housing collar of the housing independently of the rest of the housing to couple the housing to the socket and to a final engagement position of the housing and the socket;
   wherein a first electrical connector device is axially displaced into engagement with a second electrical connector device during rotation of the housing collar;
   wherein the first electrical connector device and the second electrical connector device are not rotated during independent rotation of the housing collar.

8. The method of claim 7, wherein the housing collar comprises a bayonet ring engageable with the socket.

9. The method of claim 7, wherein the housing collar comprises threads engageable with corresponding threads disposed on the socket.

10. The method of claim 7, wherein rotation of the housing collar axially displaces the housing to a final assembled condition comprising electrical connection between the first electrical connector device and the second electrical connector device, the final assembled condition further comprising coupling of the housing to the socket.

* * * * *